United States Patent
Kang et al.

(10) Patent No.: US 7,684,241 B2
(45) Date of Patent: Mar. 23, 2010

(54) FLASH MEMORY DEVICES HAVING MULTI-PAGE COPYBACK FUNCTIONALITY AND RELATED BLOCK REPLACEMENT METHODS

(75) Inventors: Sang-Chul Kang, Gyeonggi-Do (KR); Yong-Taek Jeong, Daegu (KR)

(73) Assignee: Samsung Electronics Co., Ltd. (KR)

( * ) Notice: Subject to any disclaimer, the term of this patent is extended or adjusted under 35 U.S.C. 154(b) by 244 days.

(21) Appl. No.: 11/843,902

(22) Filed: Aug. 23, 2007

(65) Prior Publication Data

US 2008/0068886 A1 Mar. 20, 2008

(30) Foreign Application Priority Data

Aug. 28, 2006 (KR) ........................ 10-2006-0081740
Aug. 20, 2007 (EP) ................................... 07016257

(51) Int. Cl.
*G11C 16/06* (2006.01)
(52) U.S. Cl. ........................... 365/185.09; 365/185.12; 365/189.04
(58) Field of Classification Search ............ 365/185.09, 365/185.22, 189.04, 189.05, 200, 185.11, 365/185.12
See application file for complete search history.

(56) References Cited

U.S. PATENT DOCUMENTS

| | | | | |
|---|---|---|---|---|
| 4,520,441 A | * | 5/1985 | Bandoh et al. | ............... 711/203 |
| 5,996,041 A | | 11/1999 | Kim | |
| 6,813,184 B2 | | 11/2004 | Lee | |
| 6,850,436 B2 | | 2/2005 | Ogawa | |
| 7,203,791 B2 | * | 4/2007 | Lee | ............................ 711/103 |
| 7,472,331 B2 | * | 12/2008 | Kim | ............................ 714/763 |
| 2003/0016559 A1 | | 1/2003 | Kawai et al. | |
| 2004/0221092 A1 | | 11/2004 | Lee | |
| 2005/0005058 A1 | * | 1/2005 | Gan et al. | .................... 711/103 |
| 2006/0013048 A1 | * | 1/2006 | Kim | .......................... 365/200 |
| 2006/0164885 A1 | | 7/2006 | Yang et al. | |

FOREIGN PATENT DOCUMENTS

JP  05-282883 A  10/1993

(Continued)

OTHER PUBLICATIONS

European Search Report, Application No. 07016257.3, Sep. 23, 2008, 7 pages.

*Primary Examiner*—Gene N. Auduong
(74) *Attorney, Agent, or Firm*—Myers Bigel Sibley & Sajovec

(57) ABSTRACT

Methods of executing a multi-page copyback program in a non-volatile memory device are provided, where the non-volatile memory device includes a memory having a plurality of memory blocks. A page of data of the memory block having a first address is replaced responsive to a generated multi-page copyback program command. It is determined if the first address of the page of data is the same as a stored address of the page at which the failure was detected. The first address is incremented if it is determined that the first address and the stored address are not the same. The pages of data are replaced, the addressed are compared and the addresses are incremented until it is determined that the incremented address and the stored address are the same. Related devices and systems are also provided herein.

33 Claims, 12 Drawing Sheets

FOREIGN PATENT DOCUMENTS

| | | |
|---|---|---|
| JP | 2003-151291 | 5/2003 |
| KR | 10-2003-0025406 A | 3/2003 |
| KR | 1020030053028 A | 6/2003 |
| KR | 10-2003-0061877 A | 7/2003 |
| KR | 1020030061877 A | 7/2003 |
| KR | 10-2004-008717 A | 1/2004 |

* cited by examiner

SR : Status Read

SR : Status Read

SR : Status Read

FLASH MEMORY DEVICES HAVING MULTI-PAGE COPYBACK FUNCTIONALITY AND RELATED BLOCK REPLACEMENT METHODS

CROSS-REFERENCE TO RELATED APPLICATION

This application claims the benefit of Korean Patent Application No. 2006-0081740, filed Aug. 28, 2006 and European Patent Application No. 07016257.3, filed on Aug. 20, 2007, the disclosures of which are hereby incorporated herein by reference in their entirety.

FIELD OF THE INVENTION

The present invention relates to integrated circuit memory devices and, more particularly, to non-volatile memory devices and related methods.

BACKGROUND OF THE INVENTION

Semiconductor memory devices for storing data can typically be categorized as either volatile memory devices or nonvolatile memory devices. Volatile memory devices lose their stored data when their power supplies are interrupted. Nonvolatile memory devices, on the other hand, retain their stored data even when their power supplies are interrupted. Thus, nonvolatile memory devices are widely used in applications where the possibility of power supply interruption is present.

Conventional nonvolatile memory devices include a type of electrically erasable programmable read only memory (EEPROM) device typically referred to as a flash EEPROM device. Flash EEPROM devices typically include a semiconductor substrate of first conductivity type, for example, p-type, spaced source and drain regions of second conductivity type, for example, n-type, in the substrate, a channel region at a face of the substrate, between the spaced source and drain regions, a floating gate for storing charge carriers when the device is programmed and a control gate which overlies the floating gate, opposite the channel region. Conventional flash EEPROM integrated circuit memory devices may contain column-by-column arrays of NAND EEPROM cells having the general construction illustrated in cross-section and schematically by FIGS. 11.58 and 11.59 from a handbook by B. Prince et al. entitled Semiconductor Memories, John Wiley & Sons Ltd., pp. 603-604 (1991); and in an article by M. Momodomi et al. entitled An Experimental 4-Mbit CMOS EEPROM with a NAND Structured Cell, IEEE Journal of Solid State Circuits, Vol. 24, No. 5, p. 1238 Oct. (1989). Typical schematic and cross-sectional layouts of arrays containing NAND EEPROM cells are also more fully described in commonly assigned U.S. Pat. No. 5,546,341 to Suh et al. entitled *Nonvolatile Semiconductor Memory*.

Operation of a flash EEPROM device is typically divided into three modes including programming, erasing and reading. Programming of a flash EEPROM device is typically achieved by biasing the drain region to a first positive bias, relative to the source region, and biasing the control gate to a second positive bias, which is greater than the first positive bias. In the absence of any stored charge on the floating gate, these biases cause the formation of an inversion-layer channel of electrons at the face of the substrate, between the source and drain regions. As will be understood by those skilled in the art, the drain-to-source voltage accelerates these electrons through the channel to the drain region where they acquire sufficiently large kinetic energy and are typically referred to as "hot" electrons. The larger positive bias on the control gate also establishes an electrical field in a tunneling oxide layer, which separates the floating gate from the channel region. This electric field attracts the hot electrons and accelerates them toward the floating gate, which is disposed between the control gate and the channel region, by a process known as tunneling. The floating gate then accumulates and traps the accumulated charge. Fortunately, the process of charging the floating gate is self-limiting. The negative charge that accumulates on the floating gate reduces the strength of the electric field in the tunneling oxide layer to the point where it is no longer capable of accelerating "hot" electrons from the drain side of the channel region.

As will be understood by those skilled in the art, the accumulation of a large quantity of trapped charge (electrons) on the floating gate may cause the effective threshold voltage ($V_{th}$) of the field effect transistor including the source region, drain region, channel region and control gate to increase. If this increase is sufficiently large, the field effect transistor will remain in a nonconductive "off" state when a predetermined "read" voltage is applied to the control gate during a read operation (i.e., $V_{th} > V_{read}$). In this state, known as the programmed state, the EEPROM device may be said to be storing a logic 0. Once programmed, the EEPROM device retains its higher threshold voltage even when its power supply is interrupted or turned off for long periods of time.

Erasing of the EEPROM device may also be achieved by removing the stored charge from the floating gate. The erasure process can be achieved, for example, by grounding the control gate and applying a positive bias to the substrate, for example, 10-20 Volts. Accordingly, flash EEPROM devices typically require bulk erasure of large portions of an array of cells since the effects of applying a large substrate bias typically cannot be confined to a single EEPROM cell.

Reading of the EEPROM device is achieved by applying a predetermined read voltage (Vread) to the control gate, typically via a word line connecting a row (i.e., page) of identical EEPROM devices or "cells", and applying a positive bias to the drain region, typically via a bit line connecting a column of identical EEPROM cells. If the EEPROM device is programmed, it will not conduct drain current ($I_{ds}$) and the bit line will remain at the positive bias. However, if the EEPROM device has not been programmed, or has been erased, it will heavily conduct and pull the bit lie down to ground potential (GND). In this state, the EEPROM device may be said to be storing a logic 1. Thus, by monitoring the bit line current and voltage, the programmed state (i.e., 1 or 0) of the EEPROM device can be determined.

During the performance of a reading operation, it may become necessary to perform a page copy operation by copying data read from a first page of memory cells at a first address to a second page of memory cells at a second different address. A conventional page copy operation typically includes reading data from a first page of memory cells in an array to a page buffer and then to a storage device external to the page buffer. Then, the data in the storage device is returned to the page buffer and then reprogrammed into the second page of memory cells using conventional programming operations. Unfortunately, conventional page copy operations may require external storage and typically require that such external storage be loaded serially from the page buffer and downloaded serially to the page buffer, which can very time consuming.

To address the potential problems discussed above, alternative page copy operations were developed. For example, in another conventional method, a first page of data is read into a page buffer where it is retained in an inverted format. The retained data is then stored back into the memory at an address of a second page. However, these page copy operations are limited because the copy of the original data from the first page is not stored as a "true" copy but is stored as an inverted copy. Accordingly, during subsequent read operations, it is possible for data errors to occur if the inverted copy is treated as a true copy.

U.S. Pat. No. 5,996,041 to Kim discusses a method of determining if the copy is the inverted or true copy. As discussed therein, integrated circuit memory devices with page copy flag cells are provided. These integrated circuit memory devices include an array of memory cells and a plurality of flag cells coupled thereto which retain a flag to indicate whether a respective page of memory cells contains data copied in an inverted format from another page of memory cells. The flag may constitute a logic 1 (or logic 0) signal stored in the flag EEPROM cell to indicate whether the data in the corresponding page of memory is a true or an inverted copy of a page of data copied from another page at a different address. A page buffer is also provided to retain data read from a page of memory and read from a corresponding flag cell, and an exclusive OR gate for inverting the data output by the page buffer if the flag has been set and passing the output data unchanged if the flag has not been set. Although the teachings of this patent may address the possibility of using a wrong version of the copied page, this method can still be very time consuming.

Notwithstanding the above described memory devices and methods for performing page copy operations, there continues to be a need for improved memory devices and methods for performing page copy operations.

SUMMARY OF THE INVENTION

Some embodiments of the present invention provide methods of executing a multi-page copyback program in a non-volatile memory device, where the non-volatile memory device includes a memory having a plurality of memory blocks. A page of data of the memory block having a first address is replaced responsive to a generated multi-page copyback program command. It is determined if the first address of the page of data is the same as a stored address of the page at which the failure was detected. The first address is incremented if it is determined that the first address and the stored address are not the same. The pages of data are replaced, the addressed are compared and the addresses are incremented until it is determined that the incremented address and the stored address are the same.

In further embodiments of the present invention, a status of the replaced page may be determined. In certain embodiments of the present invention, a status of all of the replaced pages may be determined. The multi-page copyback program may be suspended and/or resumed.

In still further embodiments of the present invention, generating the multi-page copyback program command may include receiving a multi-page copyback command from a host and generating at least one single-page copyback command responsive to the multi-page copyback command received from the host.

Some embodiments of the present invention provide methods of programming data in and/or reading data from a non-volatile memory device, where the non-volatile memory device includes a memory having a plurality of memory blocks. A program/read failure is detected during a programming/reading operation of the non-volatile memory device. An address of a page of one of the memory blocks at which the failure was detected is stored. A multi-page copyback program command is received. The multi-page copyback program is executed. The multi-page copyback program includes replacing a page of data of the memory block having a first address responsive to the generated multi-page copyback program command; determining if the first address of the page of data is the same as the stored address of the page at which the failure was detected; incrementing the first address if it is determined that the first address and the stored address are not the same; and repeating the replacing and determining steps with the incremented address until it is determined that the incremented address and the stored address are the same.

Further embodiments of the present invention provide methods of replacing a memory block in a non-volatile memory device. The memory block includes a plurality of pages of data. A program/read failure is detected during a program/read operation of the non-volatile memory device. A page address of one of the plurality of pages of data of the memory block at which the program/read failure was detected is stored. A multi-page copyback command is received responsive to the program or read failure. Pages of data are replaced in the memory block responsive to the multi-page copyback command until the stored page address of the failed page is reached.

Still further embodiments of the present invention provide non-volatile memory devices including a memory and a control unit. The memory includes at least one memory block and the memory block includes a plurality of pages of data. The control unit is coupled to the memory and configured to execute a multi-page copyback command received from a host responsive to a program/read failure of a page of data in one of the at least one memory blocks. The failed page has an associated failed page address and the multi-page copyback command is configured to initiate a replacement process for at least one of the plurality of pages of data until the failed page address is reached.

In some embodiments of the present invention, the control unit may further include a memory controller and an address generator coupled to the memory controller. The memory controller may be configured to set the failed page address in the address generator. The address generator may be configured to increment a page address until the incremented page address is the same as the failed page address set by the memory controller and provide a flag signal to the memory controller indicating the failed memory address has been reached.

In further embodiments of the present invention, the control unit may further include a program/read controller coupled to the address generator and the memory controller. The program/read controller may be configured to receive at least one single-page copyback command from the memory controller and initiate a single-page copyback operation responsive to the at least one single-page copy-back command.

In still further embodiments of the present invention, the memory controller may be further configured to provide the at least one single-page copyback command to the program/read controller.

In some embodiments of the present invention, the address generator may include a counter, a register and a comparator. The counter may be configured to receive a command from the program/read controller indicating a start of the single-page copyback operation and increment a page address responsive thereto. The register may be configured to store the failed page address set by the memory controller. The comparator may be configured to compare the incremented page address and the failed page address until the incremented page address and the failed page address are the same and provide the flag signal to the memory controller indicating the failed memory address has been reached.

In further embodiments of the present invention, the memory may further include a program/read circuit coupled to the control unit and configured to program/read data into the pages of the memory block until the failed page address is the same as the incremented page address. The control unit may further include a verification circuit coupled to the program/read circuit. The verification circuit may be configured to perform a status check after each page is replaced and provide the status to a program/read controller.

In still further embodiments of the present invention, the control unit may further include a suspend and resume circuit coupled to the memory controller that is configured to suspend and/or resume replacement operations.

Some embodiments of the present invention provide a system including a microprocessor, a user interface and a modem and non-volatile memory device all electrically coupled. The non-volatile memory device includes a memory and a control unit. The memory includes at least one memory block including a plurality of pages of data. The control unit is configured to execute a multi-page copyback command received from a host responsive to a program or read failure of a page of data in one of the at least one memory blocks. The failed page has an associated failed page address and the multi-page copyback command is configured to initiate a replacement process for at least one of the plurality of pages of data until the failed page address is reached.

In further embodiments of the present invention, the system may further include a battery that is electrically coupled to the microprocessor, the user interface, the modem and the memory device and wherein the system is included in a portable electronic device.

Still further embodiments of the present invention provide a system including a microprocessor, a user interface, a modem, a non-volatile memory and a control unit all electrically coupled. The non-volatile memory includes at least one memory block including a plurality of pages of data. The control unit is coupled to the non-volatile memory and is configured to execute a multi-page copyback command received from a host responsive to a program or read failure of a page of data in one of the at least one memory blocks. The failed page has an associated failed page address and the multi-page copyback command is configured to initiate a replacement process for at least one of the plurality of pages of data until the failed page address is reached.

DETAILED DESCRIPTION OF EMBODIMENTS OF THE INVENTION

Figure 1:
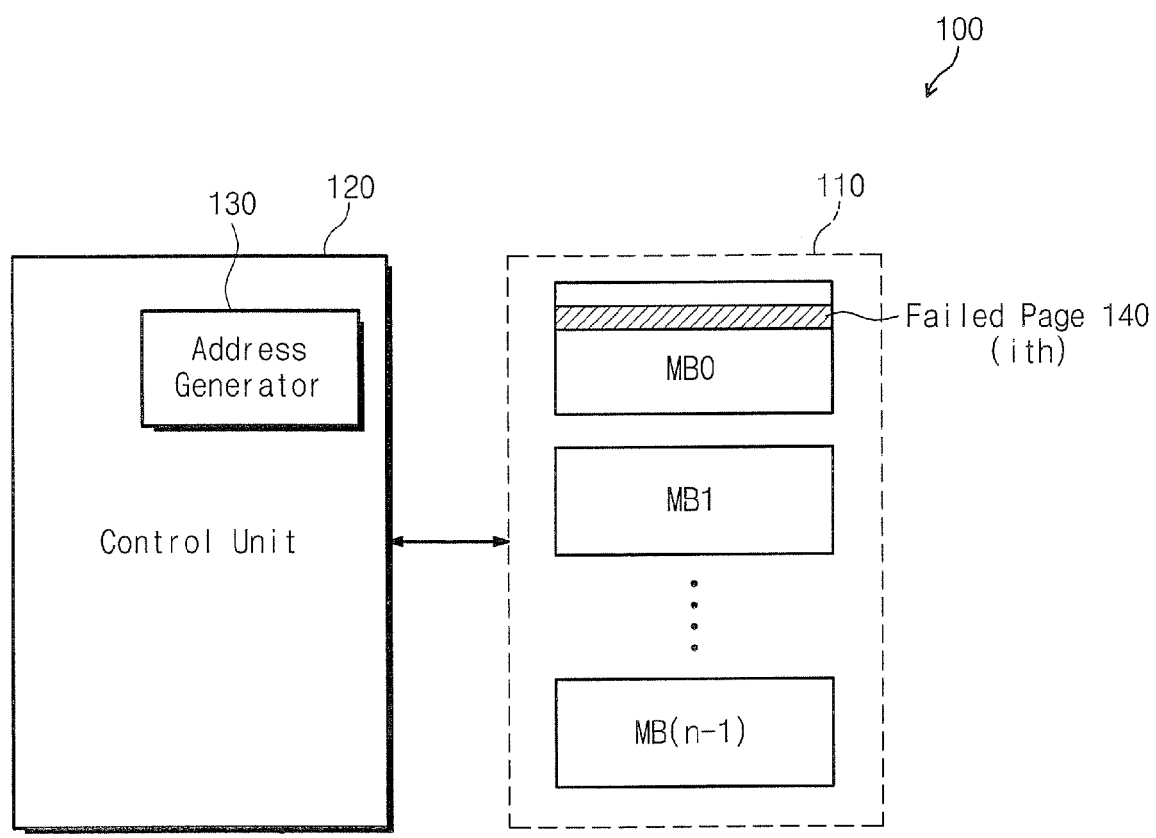
FIG. 1 is a block diagram illustrating a flash memory according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes or configurations of elements may be idealized or exaggerated for clarity.

It will be understood that when an element is referred to as being "connected to" or "coupled to" another element, it may be directly connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third etc. may be used herein to describe various elements, components and/or sections, these elements, components and/or sections should not be limited by these terms. These terms are only used to distinguish one element, component, or section from another element, component or section. Thus, a first element, component or section discussed below could be termed a second element, component or section without departing from the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification, and will not be interpreted in an idealized or overly formal sense unless expressly so defined herein.

Some embodiments of the present invention will now be described with respect to FIGS. 1 through 14. As discussed below, some embodiments of the present invention provide methods, devices and systems for multi-page copyback operations. Multi-page copyback operations according to some embodiments of the present invention may be performed automatically responsive to a command from a control unit. In particular, a page of data of a memory block having a first address is replaced responsive to an automatically generated multi-page copyback program command. It is determined if the first address of the page of data is the same as a stored address of the page at which the failure was detected. The first address is incremented if it is determined that the first address and the stored address are not the same. The replacing and determining steps with the incremented address are repeated until it is determined that the incremented address and the stored address are the same. Thus, according to some embodiments of the present invention, copyback operations may be performed faster and more efficiently as will be discussed in detail below with respect to FIGS. 1 through 14.

Referring now to FIG. 1, a block diagram illustrating a flash memory 100 according to some embodiments of the present invention will be discussed. In some embodiments of the present invention, the flash memory device 100 may be a OneNAND™ flash memory device provided by Samsung Electronics Co., Ltd. of the Republic of Korea. As illustrated in FIG. 1, the flash memory includes a memory core 110 and a control unit 120. The memory core 110 includes one or more memory blocks MB0, MB1 . . . MB(n−1). Each of the memory blocks MB0, MB1 . . . MB(n−1) includes a plurality of pages of data. In some embodiments of the present invention, the memory blocks MB0, MB1 . . . MB(n−1) may include flash memory cells.

The control unit 120 is coupled to the memory core 110 and includes an address generator 130. The control unit 120 is configured to execute a multi-page copyback command according to some embodiments of the present invention. The multi-page copyback command may be received from a host (not shown) responsive to a program/read failure (140) of a page of data in one of the memory blocks MB0, MB1 . . . MB(n−1). The failed page 140 has an associated failed page address. The failed page address associated with the failed page 140 is stored in the address generator 130. The multi-page copyback command according to some embodiments of the present invention provided from, for example, the host, initiates a replacement process for at least one of the plurality of pages of data until the failed page address of the failed page is reached.

Figure 2:
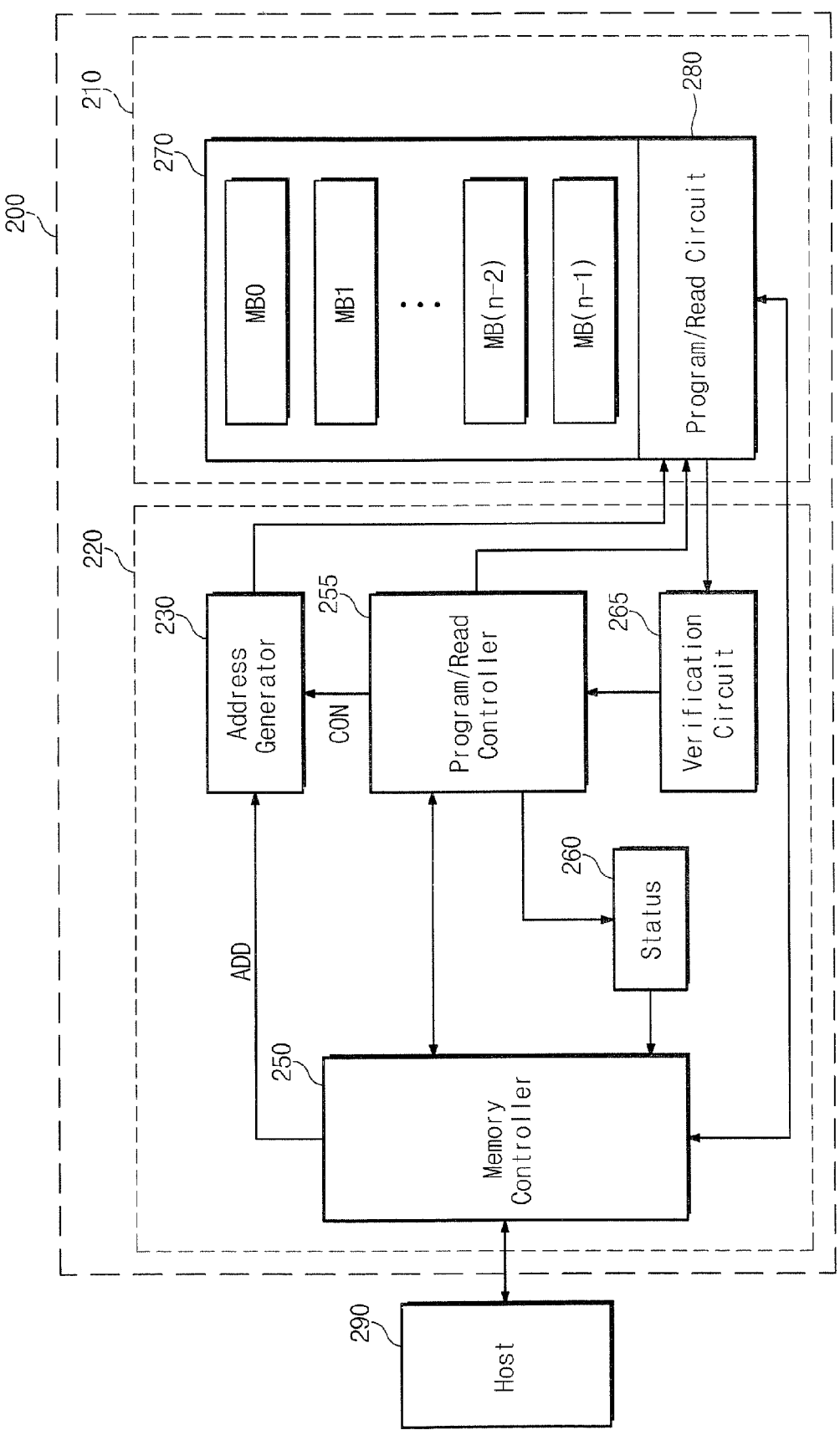
FIG. 2 is a more detailed block diagram illustrating a flash memory according to some embodiments of the present invention.

Referring now to FIG. 2, a more detailed block diagram illustrating flash memories 200 according to some embodiments of the present invention will be discussed. As illustrated in FIG. 2, the flash memory 200 communicates with a host 290 and includes the memory core 210 and the control unit 220 as discussed with respect to FIG. 1. As discussed above with respect to FIG. 1, the host 290 may provide the multi-page copyback command to the control unit 220. The control unit includes a memory controller 250, an address generator 230, a program/read controller 255, a status module 260 and a verification circuit 265. It will be understood that although the memory controller 250, the address generator 230, the program/read controller 255, the status module 260 and the pass/fail module 265 of the control unit 220 are illustrated in FIG. 2 as separate elements, embodiments of the present invention are not limited to this configuration. For example, one or more of the elements in the control unit 220 can be combined without departing from the scope of the present invention.

As illustrated in FIG. 2, the address generator 230 is coupled to the memory controller 250. The memory controller 250 is configured to set the failed page address in the address generator 230. The address generator 230 is configured to increment a page address until the incremented page address is the same as the failed page address set by the memory controller 250. In some embodiments of the present invention, the address generator 230 provides a flag signal to the memory controller 250 indicating the failed memory address has been reached. It will be understood that address generator 230 can communicate that the failed memory address set therein by the memory controller 250 has been reached using any method known to those having skill in the art without departing from the scope of the present invention.

The program/read controller 255 of the control unit 220 is also coupled to the address generator 230 and the memory controller 250 as illustrated in FIG. 2. The program/read controller 255 is configured to receive at least one single-page copyback command from the memory controller 250 and initiate a single-page copyback operation responsive to the at least one single-page copy-back command. As discussed above, the memory controller 250 is configured to provide the at least one single-page copyback command to the program/read controller 255 responsive to the multi-page copyback command received from the host 290.

As further illustrated in FIG. 2, the memory core 210 includes one or more memory blocks 270 (MB0, MB1 . . . MB(n−2), MB(n−1)) and a program/read circuit 280. The program/read circuit 280 is coupled to the control unit 220 and is configured to program/read data into the pages of the memory block 270 until the failed page address is the same as the incremented page address.

In some embodiments of the present invention, the program/read circuit 280 of the memory core 210 may include a row selection circuit, a column selection circuit, a page buffer circuit and a high voltage generator, which are known to those having skill in the art.

As discussed above, the control unit 230 further comprises a verification circuit 265 coupled to the program/read circuit 280 of the memory core 210 that is configured to perform a status check after each page is replaced and provide the status to the program/read controller 255 of the control unit 220.

Figure 3:
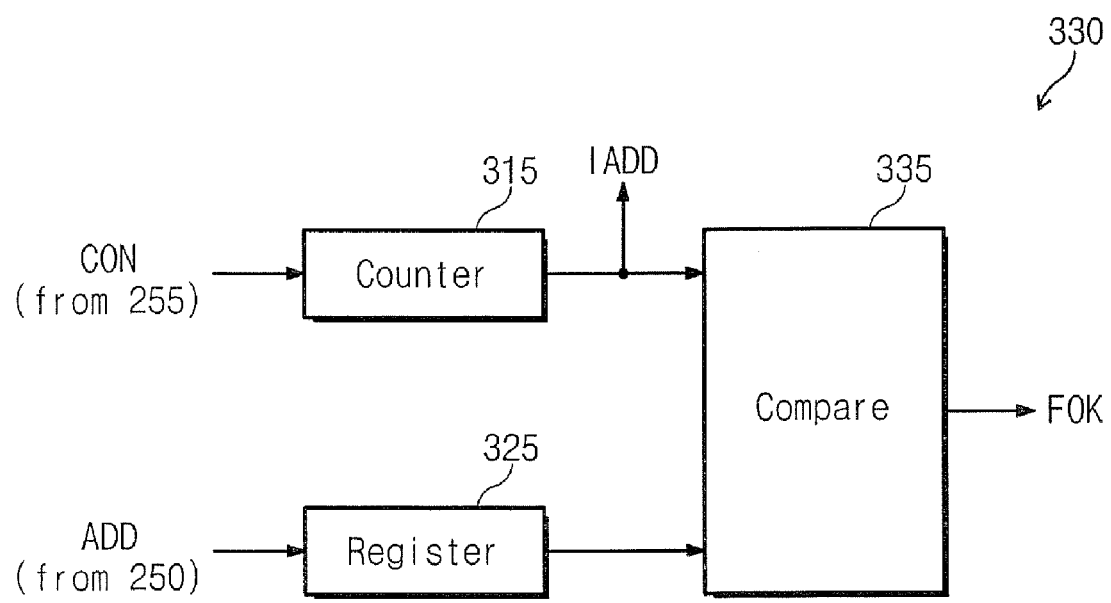
FIG. 3 is a block diagram illustrating an address generator according to some embodiments of the present invention.

Referring now to FIG. 3, a detailed block diagram illustrating an address generator 330 according to some embodiments of the present invention will be discussed. As illustrated in FIG. 3, the address generator 330 includes a counter 315, a register 325 and a comparator 335. The counter 315 is configured to receive a command from the program/read controller 255 and indicate a start of the single-page copyback operation and increment a page address responsive thereto. The register 325 is configured to store the failed page address set by the memory controller 250. The comparator 335 is configured to compare the incremented page address and the failed page address until the incremented page address and the failed page address are the same and provide the flag signal to the memory controller 250 indicating the failed memory address has been reached.

It will be understood that the address generator 330 provided in FIG. 3 is provided for exemplary purposes only and, therefore, embodiments of the present invention are not limited to this configuration. Any configuration of an address generator that would support embodiments of the present invention may be used without departing from the scope of the present invention.

Figure 4:
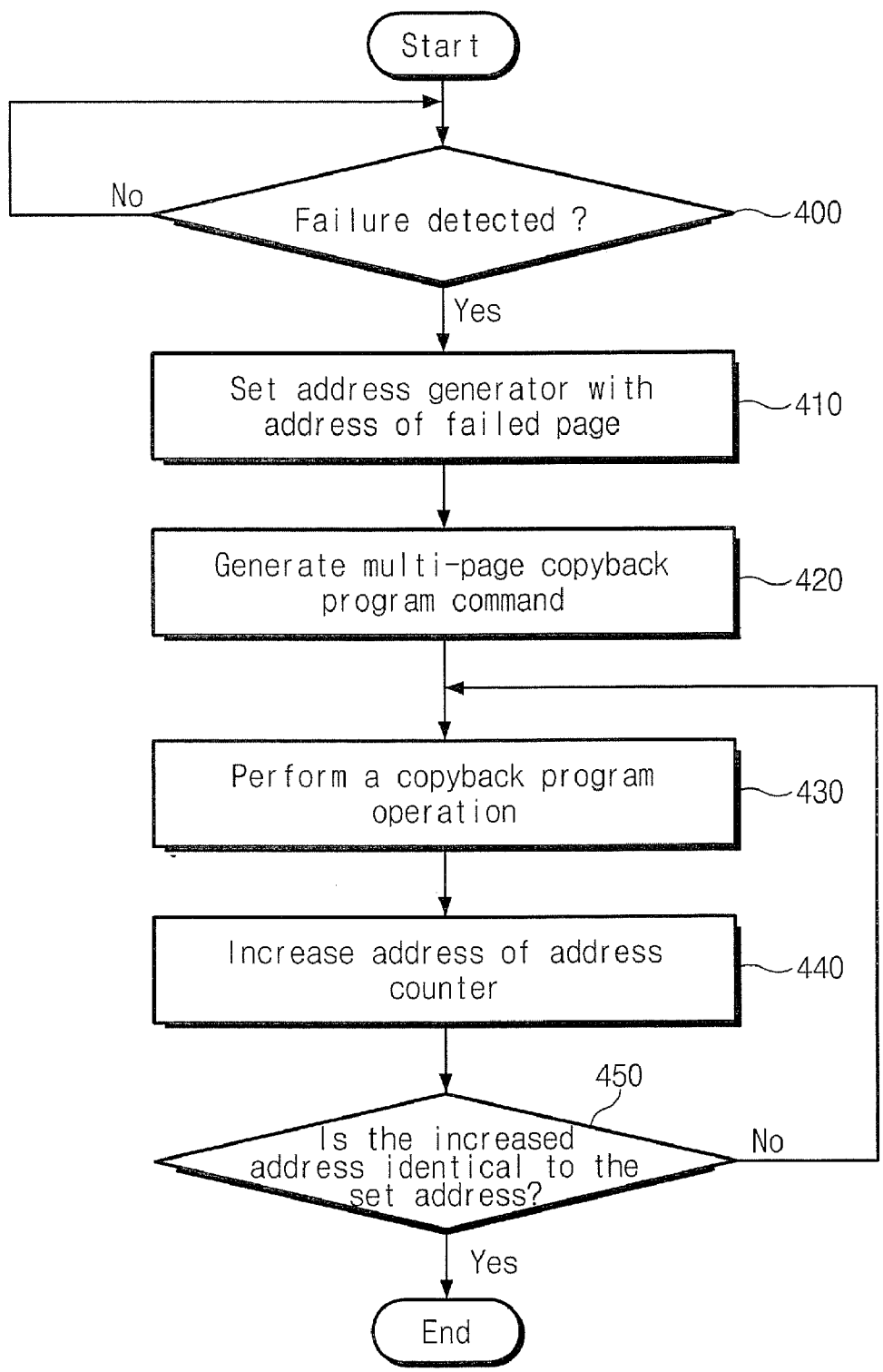
FIG. 4 is a flowchart illustrating operations of a multi-page copyback operation according to some embodiments of the present invention.

Referring now to the flowchart of FIG. 4, operations for programming data in and/or reading data from a non-volatile memory device according to some embodiments of the present invention will be discussed. As discussed above, the non-volatile memory device includes a memory having a plurality of memory blocks. As illustrated in FIG. 4, operations begin at block 400 by determining if a program/read failure has been detected during a programming/reading operation of the non-volatile memory device. If a program/read failure has not be detected (block 400), operations remain at block 400 until a program/read failure has been detected. If, on the other hand, a program/read failure has been detected (block 400), operation proceed to block 410 where an address of a page of one of the memory blocks at which the failure was detected is stored (or set). As discussed above, the memory controller 250 may be configured to set the address of the failed page in the register 325 of the address generator 330. A multi-page copyback program command may be generated (block 420). As discussed above, the multi-page copyback command may be received from a host 290 at the memory controller 250. The memory controller 250 may provide the command to the program/read controller 255 of the control unit 220. The multi-page copyback program may be executed responsive to the multi-page copyback command. The multi-page copyback program includes blocks 430-450 of the flowchart of FIG. 4.

In particular, a page of data of the memory block having a first address may be replaced responsive to the generated multi-page copyback program command (block 430). The address in the counter of the address generator is incremented (block 440) and it is determined if the increased address of the page of data is the same as the stored address of the page at which the failure was detected (block 450). If it is determined that the addresses are the same (block 450), operations cease. If, on the other hand, it is determined that the addresses are not the same, operations of block 430 through 450 are repeated until it is determined at block 450 that the addresses are the same.

Figure 8:
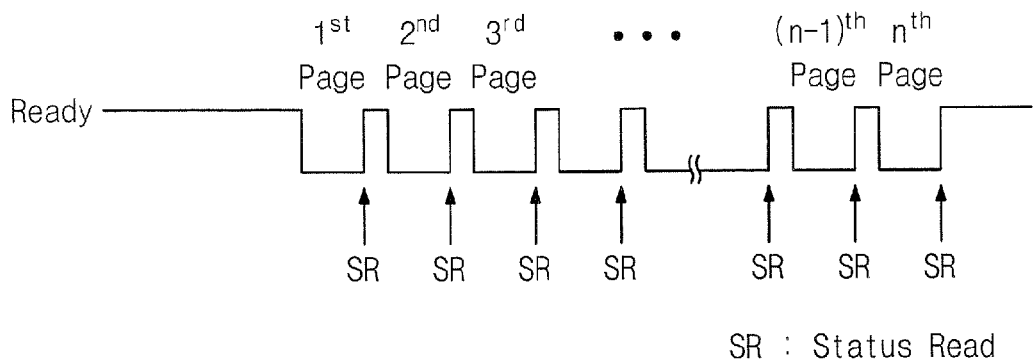
FIG. 8 is a timing diagram illustrating a status read operation according to some embodiments of the present invention.

In some embodiments of the present invention, operations of replacing may include determining a status of the replaced page as illustrated by the timing diagram of FIG. 8. Furthermore, in some embodiments, before the operation of blocks 430-450 are repeated, a status of all of the replaced pages may be determined as illustrated by the timing diagram of FIG. 6. In still further embodiments of the present invention, the step of incrementing (block 440) may be followed by suspending the multi-page copyback program and/or resuming the suspended multi-page copyback program which can be performed by the suspend and resume circuit 1187 of FIG. 11 as will be discussed further below.

Figure 5:
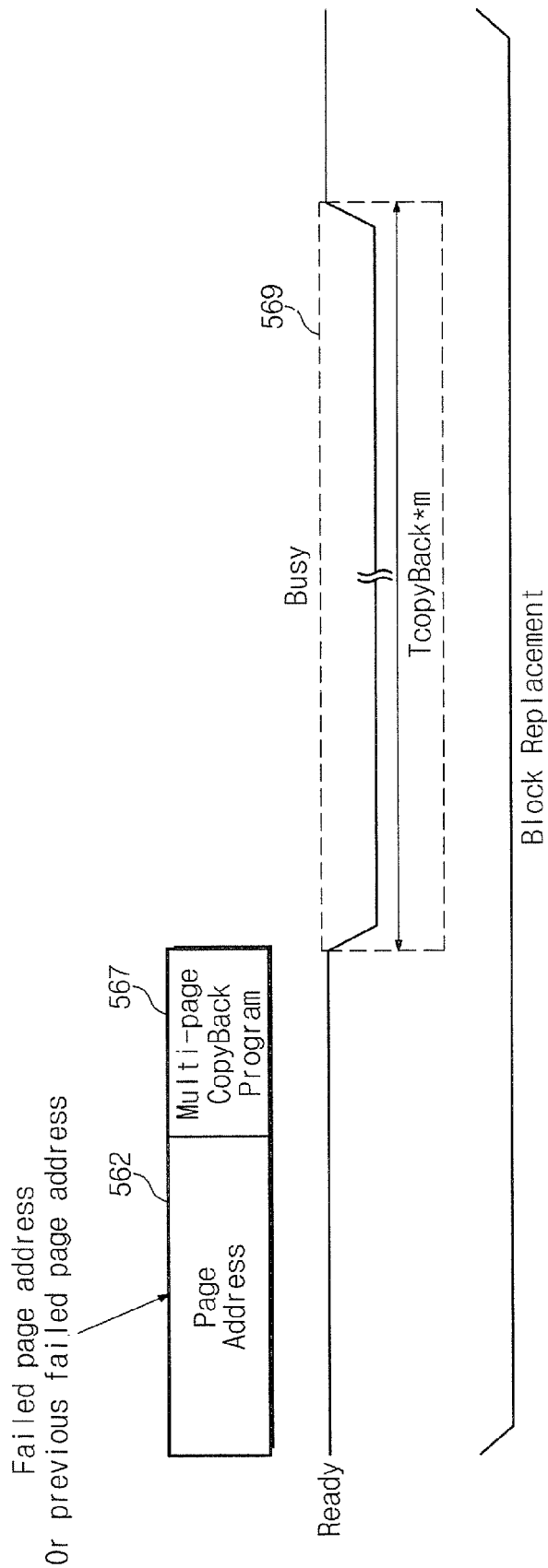
FIG. 5 is a timing diagram illustrating copyback operations according to some embodiments of the present invention.

Referring now to FIGS. 5 through 8, timing diagrams according to various embodiments of the present invention will be discussed. As illustrated in FIG. 5, once a failed page address 562 is set, a multi-page copyback program 567 according to some embodiments of the present invention will be performed. The busy portion of the timeline 569 represents the block replacement.

Figure 6:
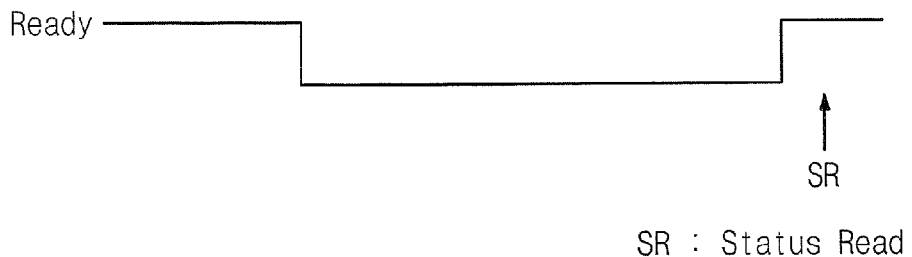
FIG. 6 is a timing diagram illustrating a status read operation according to some embodiments of the present invention.
Figure 7:
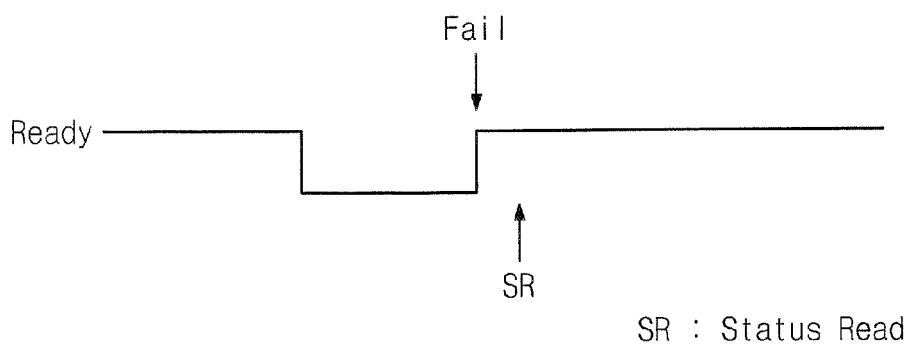
FIG. 7 is a timing diagram illustrating a status read operation according to some embodiments of the present invention.

As illustrated in the timing diagram of FIG. 6, a status read operation may be performed over the whole block. Furthermore, as illustrated in the timing diagram of FIG. 8, a status read operation may be performed after each page. Finally, as illustrated by the timing diagram of FIG. 7, a status read operation may be performed when program/read failure is detected.

Figure 9:
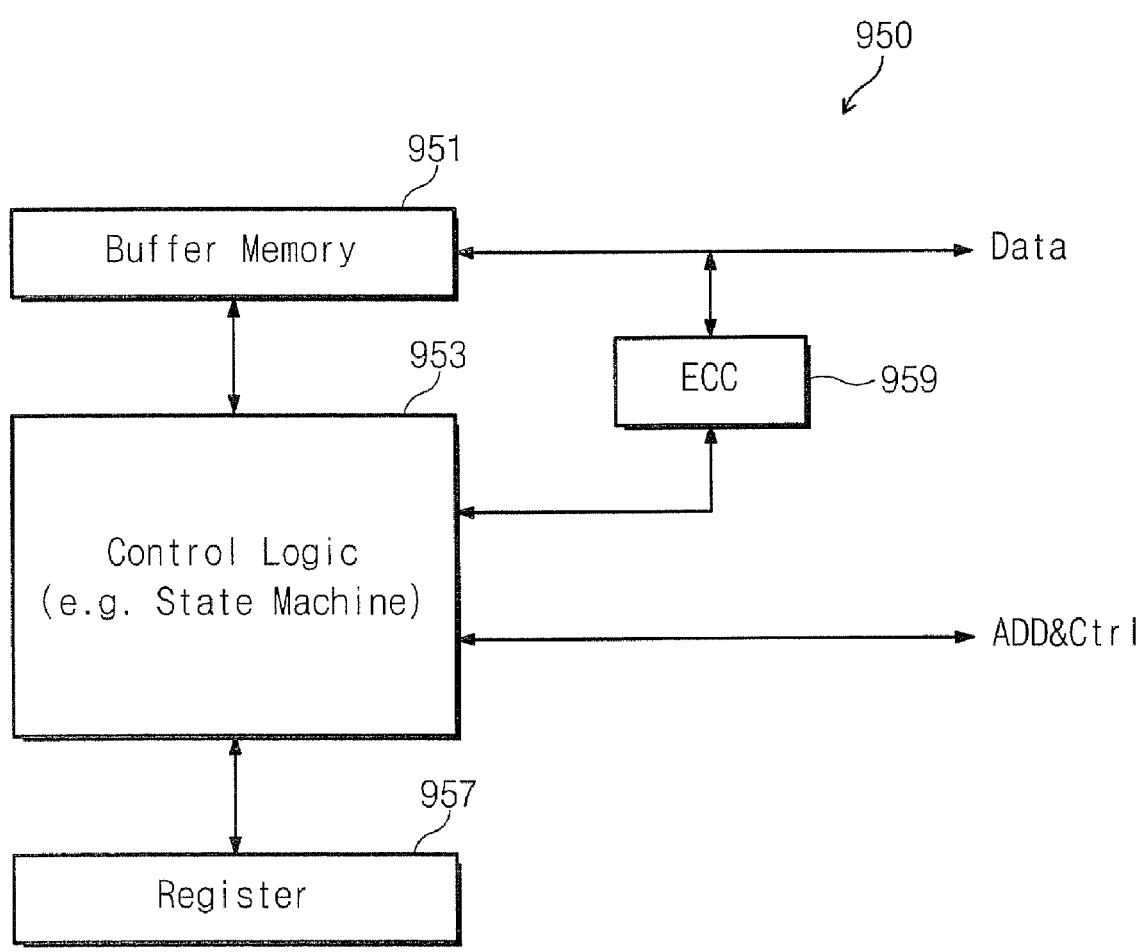
FIG. 9 is a block diagram illustrating a memory controller according to some embodiments of the present invention.

Referring now to FIG. 9, a block diagram illustrating a memory controller according to some embodiments of the present invention will be discussed. As illustrated therein, in some embodiments of the present invention the memory controller 950 may include control logic 953, a memory buffer 951, an error correction circuit (ECC) 959 and a register 957. The control logic 953 may be provided by, for example, a state machine without departing from the scope of the present invention.

Figure 10:
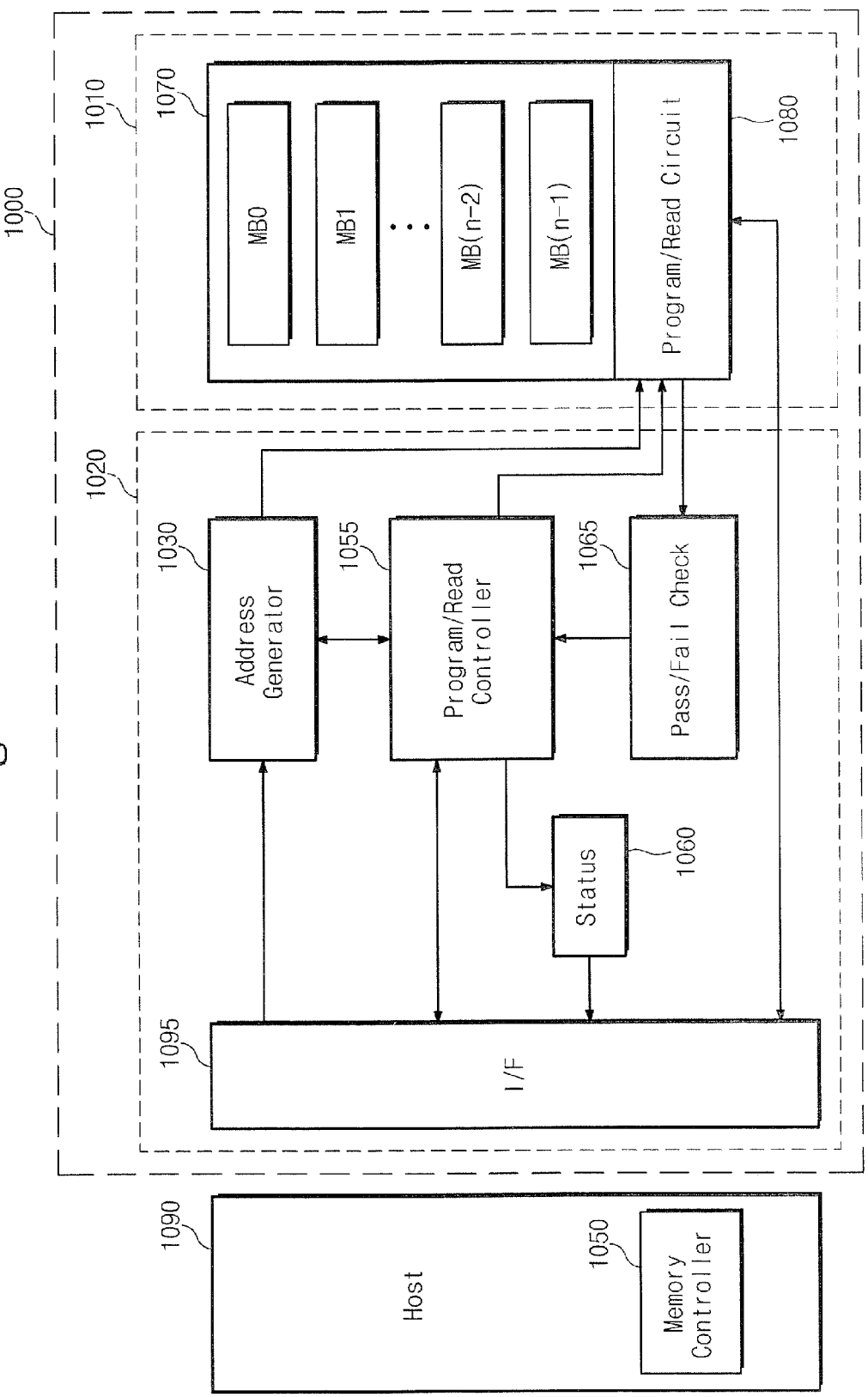
FIG. 10 is a block diagram illustrating a flash memory device according to some embodiments of the present invention.
Figure 11:
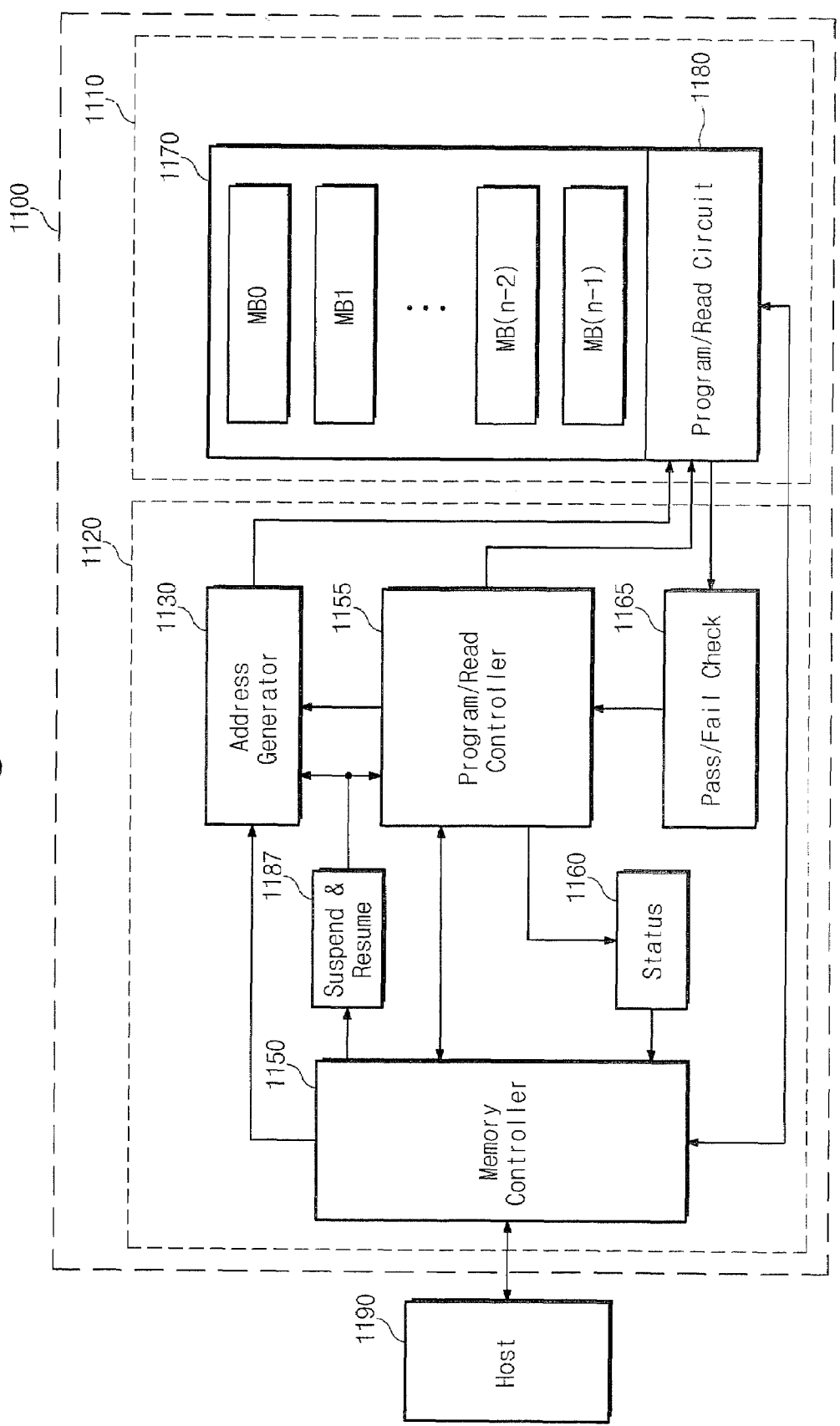
FIG. 11 is a block diagram illustrating a flash memory device according to some embodiments of the present invention.
Figure 12:
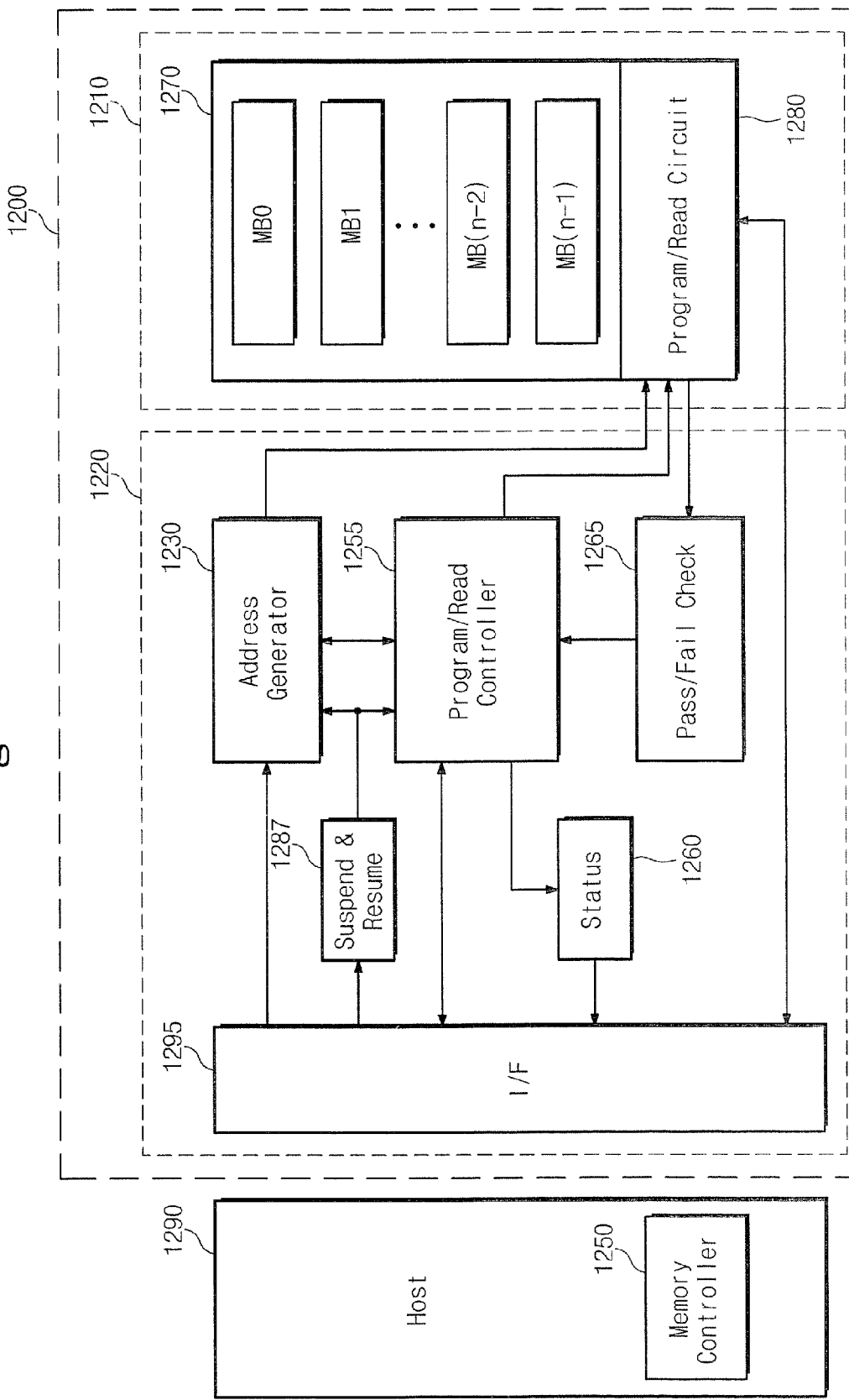
FIG. 12 is a block diagram illustrating a flash memory device according to some embodiments of the present invention.

FIGS. 10 through 12 are block diagrams illustrating flash memory devices in accordance with various embodiments of the present invention. It will be understood that the block diagrams of FIGS. 10 through 12 are similar to the block diagram discussed above with respect to FIG. 2, thus like references numerals refer to like elements therein. In the interest of brevity only the differences will be discussed with respect to FIG. 10 through 12.

As illustrated in FIG. 10, the memory controller 1050 may be provided at the host 1090 and replaced with an interface 1095 in the control unit 1020. The interface can be any interface known to those of skill in the art that can operate in accordance with embodiments of the present invention.

As illustrated in FIG. 11, a suspend and resume circuit 1187 may be provided in the control unit 1120. The suspend and resume circuit 1187 may be coupled to the memory controller 1150 and be configured to suspend and/or resume replacement operations as discussed above with respect to the flowchart of FIG. 4.

As illustrated in FIG. 12, the aspects of FIGS. 10 and 11 may also be combined to provide a memory controller 1250 in the host 1290 and a control unit 1220 including a suspend and resume circuit 1287.

Figure 13:
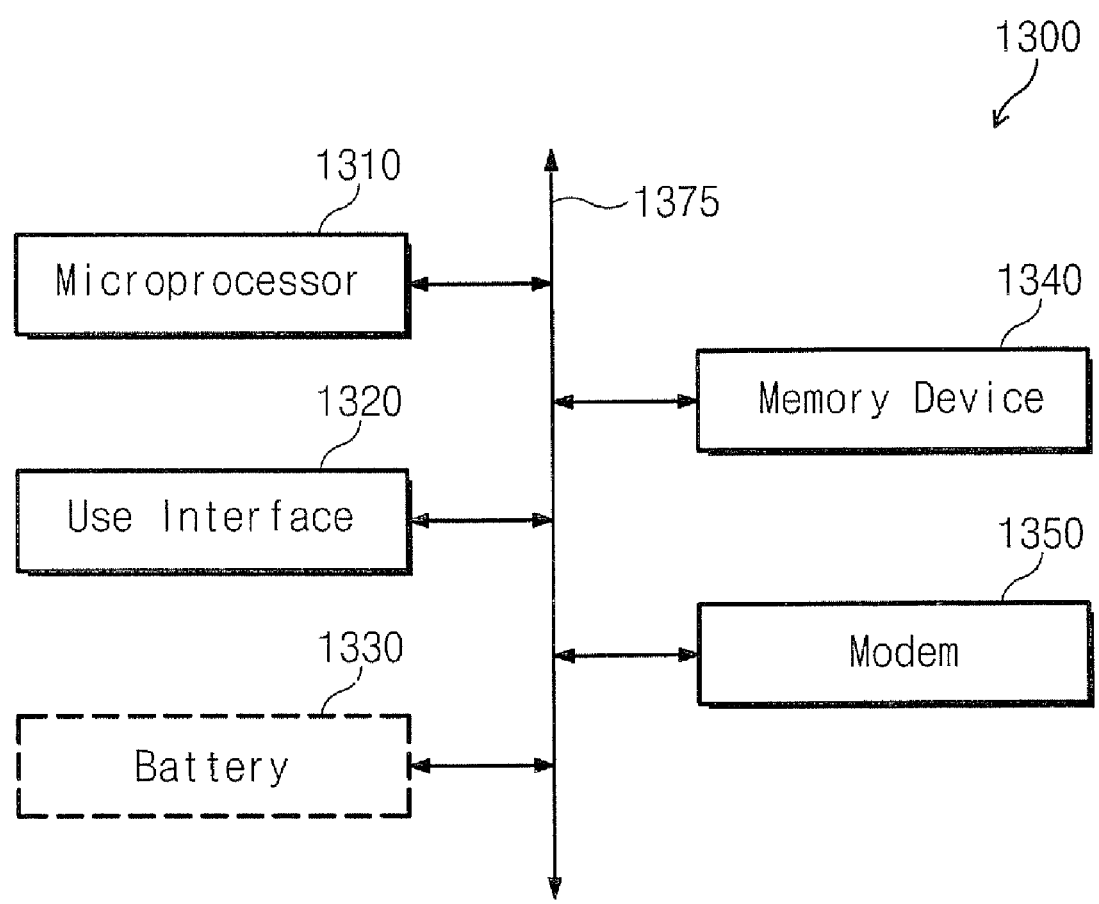
FIG. 13 is a schematic block diagram illustrating systems according to some embodiments of the present invention.

Referring now to FIG. 13 a schematic block diagram illustrating systems according to some embodiments of the present invention will be discussed. As illustrated in FIG. 13, a system 1300 according to some embodiments of the present invention may include a microprocessor 1310, a user interface 1320, a modem 1350, a non-volatile memory device 1340 and an optional batter 1330 electrically coupled by a bus 1375.

The user interface 1320 may include any man machine interface known to those having skill in the art. For example, a keypad, a touch screen, a voice activated circuit or the like. Furthermore, according to some embodiments of the present invention, the system 1300 may be included in a portable electronic device. As used herein, the term "portable electronic device" or "mobile terminal" may include: a cellular radiotelephone with or without a multi-line display; a Personal Communications System (PCS) terminal that may combine a cellular radiotelephone with data processing, facsimile and data communications capabilities; a Personal Data Assistant (PDA) that can include a radiotelephone, pager, Internet/intranet access, Web browser, organizer, calendar and/or a global positioning system (GPS) receiver; a gaming device, an audio video player, and a conventional laptop and/or palmtop portable computer that may include a radiotelephone transceiver.

The non-volatile memory device may include a memory and a control unit as discussed above with respect to FIG. 3. In particular, the memory may include one or more memory blocks including a plurality of pages of data. The control unit may be configured to execute a multi-page copyback command received from a host responsive to a program/read failure of a page of data in the one or more memory blocks. The failed page may have an associated failed page address and the multi-page copyback command is configured to initiate a replacement process for at least one of the plurality of pages of data until the failed page address is reached.

Figure 14:
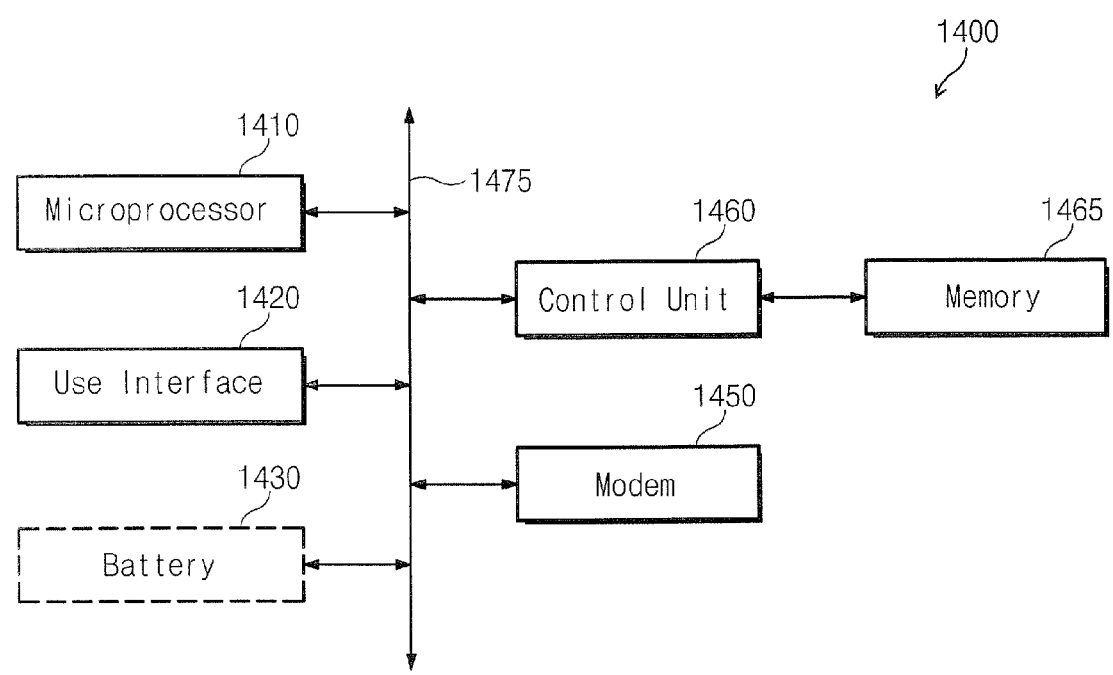
FIG. 14 is a schematic block diagram illustrating systems according to some embodiments of the present invention.

Referring now to FIG. 14, a schematic block diagram illustrating systems according to some embodiments of the present invention will be discussed. The system 1400 is similar to the system of FIG. 13 except the non-volatile memory 1465 and the control unit 1460 are separate.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims.

That which is claimed is:

1. A method of executing a multi-page copyback program in a non-volatile memory device, the non-volatile memory device including a memory having a plurality of memory blocks, the method comprising:
   replacing a page of data of the memory block having a first address responsive to a generated multi-page copyback program command;
   determining if the first address of the page of data is the same as a stored address of the page at which the failure was detected;
   incrementing the first address if it is determined that the first address and the stored address are not the same; and
   repeating the replacing and determining steps with the incremented address until it is determined that the incremented address and the stored address are the same.

2. The method of claim 1, wherein replacing is followed by determining a status of the replaced page.

3. The method of claim 1, wherein repeating is followed by determining a status of all of the replaced pages.

4. The method of claim 1, wherein incrementing if followed by suspending the multi-page copyback program.

5. The method of claim 4, wherein suspending is followed by resuming the multi-page copyback program.

6. The method of claim 1, wherein generating the multi-page copyback program command comprises receiving a multi-page copyback command from a host and generating at least one single-page copyback command responsive to the multi-page copyback command received from the host.

7. A method of programming data in and/or reading data from a non-volatile memory device, the non-volatile memory device including a memory having a plurality of memory blocks, the method comprising:
   detecting a program/read failure during a programming/reading operation of the non-volatile memory device;
   storing an address of a page of one of the memory blocks at which the failure was detected;
   receiving a multi-page copyback program command;
   executing the multi-page copyback program, the multi-page copyback program comprising:
   replacing a page of data of the memory block having a first address responsive to the generated multi-page copyback program command;
   determining if the first address of the page of data is the same as the stored address of the page at which the failure was detected;
   incrementing the first address if it is determined that the first address and the stored address are not the same; and
   repeating the replacing and determining steps with the incremented address until it is determined that the incremented address and the stored address are the same.

8. The method of claim 7, wherein replacing is followed by determining a status of the replaced page.

9. The method of claim 7, wherein repeating is followed by determining a status of all of the replaced pages.

10. The method of claim 7, wherein incrementing if followed by suspending the multi-page copyback program.

11. The method of claim 10, wherein suspending is followed by resuming the multi-page copyback program.

12. The method of claim 7, wherein generating the multi-page copyback program command comprises receiving a multi-page copyback command from a host and generating at least one single-page copyback command responsive to the multi-page copyback command received from the host.

13. A method of replacing a memory block in a non-volatile memory device, the memory block including a plurality of pages of data, comprising:
   detecting a program/read failure during a program/read operation of the non-volatile memory device;
   storing a page address of one of the plurality of pages of data of the memory block at which the program/read failure was detected;
   receiving a multi-page copyback command responsive to the program or read failure; and
   replacing pages of data in the memory block responsive to the multi-page copyback command until the stored page address of the failed page is reached.

14. The method of claim 13, wherein replacing comprises:
   replacing a page of data of the memory block having a first address responsive to the generated multi-page copyback program command;
   determining if the first address of the page of data is the same as the stored address of the page at which the failure was detected;
   incrementing the first address if it is determined that the first address and the stored address are not the same; and
   repeating the replacing and determining steps with the incremented address until it is determined that the incremented address and the stored address are the same.

15. The method of claim 13, wherein receiving comprises receiving the multi-page copyback command from a host in communication with the memory device.

16. A non-volatile memory device comprising:
   a memory including at least one memory block, the memory block including a plurality of pages of data; and
   a control unit coupled to the memory and configured to execute a multi-page copyback command received from a host responsive to a program/read failure of a page of data in one of the at least one memory blocks, the failed page having an associated failed page address and the multi-page copyback command being configured to initiate a replacement process for at least one of the plurality of pages of data until the failed page address is reached.

17. The memory device of claim 16, wherein the control unit further comprises:
   a memory controller; and
   an address generator coupled to the memory controller,
   wherein the memory controller is configured to set the failed page address in the address generator and
   wherein the address generator is configured to increment a page address until the incremented page address is the same as the failed page address set by the memory controller and provide a flag signal to the memory controller indicating the failed memory address has been reached.

18. The memory device of claim 17, wherein the control unit further comprises a program/read controller coupled to the address generator and the memory controller, the program/read controller being configured to receive at least one single-page copyback command from the memory controller and initiate a single-page copyback operation responsive to the at least one single-page copy-back command.

19. The memory device of claim 18, wherein the memory controller is further configured to provide the at least one single-page copyback command to the program/read controller.

20. The memory device of claim 18 wherein the address generator comprises:
   a counter configured to receive a command from the program/read controller indicating a start of the single-page copyback operation and increment a page address responsive thereto; and
   a register configured to store the failed page address set by the memory controller; and
   a comparator configured to compare the incremented page address and the failed page address until the incremented page address and the failed page address are the same and provide the flag signal to the memory controller indicating the failed memory address has been reached.

21. The memory device of claim 16, wherein the memory further comprises:
   a program/read circuit coupled to the control unit and configured to program/read data into the pages of the memory block until the failed page address is the same as the incremented page address.

22. The memory device of claim 21, wherein the control unit further comprises a verification circuit coupled to the program/read circuit configured to perform a status check after each page is replaced and provide the status to a program/read controller.

23. The memory device of claim 16, wherein the control unit further comprises a suspend and resume circuit coupled to the memory controller configured to suspend and/or resume replacement operations.

24. A system comprising:
   a microprocessor, a user interface and a modem all electrically coupled; and
   a non-volatile memory device electrically coupled to the microprocessor, the user interface and the modem and comprising:
   a memory including at least one memory block including a plurality of pages of data; and
   a control unit configured to execute a multi-page copyback command received from a host responsive to a program or read failure of a page of data in one of the at least one memory blocks, the failed page having an associated failed page address and the multi-page copyback command being configured to initiate a replacement process for at least one of the plurality of pages of data until the failed page address is reached.

25. The system of claim 18, wherein the system further includes a battery that is electrically coupled to the microprocessor, the user interface, the modem and the memory device and wherein the system is included in a portable electronic device.

26. The system of claim 24, wherein the control unit further comprises:
   a memory controller; and
   an address generator coupled to the memory controller, wherein the memory controller is configured to set the failed page address in the address generator and
   wherein the address generator is configured to increment a page address until the incremented page address is the same as the failed page address set by the memory controller and provide a flag signal to the memory controller indicating the failed memory address has been reached.

27. The system of claim 26, wherein the control unit further comprises a program/read controller coupled to the address generator and the memory controller, the program/read controller being configured to receive at least one single-page copyback command from the memory controller and initiate a single-page copyback operation responsive to the at least one single-page copy-back command.

28. The system of claim 27, wherein the memory controller is further configured to provide the at least one single-page copyback command to the program/read controller.

29. The system of claim 27 wherein the address generator comprises:
   a counter configured to receive a command from the program/read controller indicating a start of the single-page copyback operation and increment a page address responsive thereto; and
   a register configured to store the failed page address set by the memory controller; and
   a comparator configured to compare the incremented page address and the failed page address until the incremented page address and the failed page address are the same and provide the flag signal to the memory controller indicating the failed memory address has been reached.

30. The system of claim 24, wherein the memory further comprises:
   a program/read circuit coupled to the control unit and configured to program/read data into the pages of the memory block until the failed page address is the same as the incremented page address.

31. The system of claim 30, wherein the control unit further comprises a verification circuit coupled to the program/read circuit configured to perform a status check after each page is replaced and provide the status to a program/read controller.

32. The system of claim 24, wherein the memory controller further comprises a suspend and resume circuit coupled to the memory controller configured to suspend and/or resume replacement operations.

33. A system comprising:
   a microprocessor, a user interface and a modem all electrically coupled;
   a non-volatile memory electrically coupled to the microprocessor, the user interface and the modem, the non-volatile memory including at least one memory block including a plurality of pages of data; and
   a control unit coupled to the non-volatile memory and configured to execute a multi-page copyback command received from a host responsive to a program or read failure of a page of data in one of the at least one memory blocks, the failed page having an associated failed page address and the multi-page copyback command being configured to initiate a replacement process for at least one of the plurality of pages of data until the failed page address is reached.

* * * * *